(12) United States Patent
Cho et al.

(10) Patent No.: US 11,545,627 B2
(45) Date of Patent: Jan. 3, 2023

(54) ELECTRONIC PANEL, ELECTRONIC PANEL TEST DEVICE, AND ELECTRONIC PANEL TEST METHOD

(71) Applicant: Samsung Display Co., Ltd., Yongin-si (KR)

(72) Inventors: Daeyoun Cho, Yongin-si (KR); Jongwoo Park, Seongnam-si (KR); Youngtae Choi, Cheonan-si (KR); Jiho Moon, Hwaseong-si (KR); Ju hee Lee, Asan-si (KR); Younjae Jung, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 275 days.

(21) Appl. No.: 16/559,332

(22) Filed: Sep. 3, 2019

(65) Prior Publication Data

US 2020/0152881 A1     May 14, 2020

(30) Foreign Application Priority Data

Nov. 8, 2018 (KR) .................. 10-2018-0136736

(51) Int. Cl.
*G01R 31/26* (2020.01)
*H01L 51/00* (2006.01)
*H01L 27/32* (2006.01)

(52) U.S. Cl.
CPC ...... *H01L 51/0031* (2013.01); *G01R 31/2601* (2013.01); *G01R 31/2635* (2013.01); *H01L 27/3276* (2013.01)

(58) Field of Classification Search
CPC .......... G01R 31/2601; G01R 31/2635; G09G 3/006; G09G 2300/043; G09G 2330/02; G09G 2354/00; H01L 22/14; H01L 22/26; H01L 22/34; H01L 27/3244; H01L 27/3276; H01L 51/0031
USPC ......................................................... 324/511
See application file for complete search history.

(56) References Cited

U.S. PATENT DOCUMENTS

| 9,490,307 B2 | 11/2016 | Kim |
| 9,553,134 B2 | 1/2017 | Nam et al. |
| 10,019,088 B2 | 7/2018 | Kim et al. |
| 2006/0001792 A1* | 1/2006 | Choi .................. H01L 27/3223 349/54 |
| 2012/0062485 A1 | 3/2012 | Kim |

(Continued)

FOREIGN PATENT DOCUMENTS

| KR | 10-2012-0029008 A | 3/2012 |
| KR | 10-2014-0083633 A | 7/2014 |

(Continued)

*Primary Examiner* — Jermele M Hollington
*Assistant Examiner* — Courtney G McDonnough
(74) *Attorney, Agent, or Firm* — Lewis Roca Rothgerber Christie LLP

(57) ABSTRACT

A test device includes: a plurality of signal test pads electrically connected to pads of an input sensing unit; a power test pad electrically connected to a power pattern of a display unit; a test circuit configured to apply a test signal to the signal test pads; a voltage generator configured to generate a sensing power voltage; and a ripple controller configured to change a voltage level of the sensing power voltage to apply the sensing power voltage to the power test pad.

19 Claims, 9 Drawing Sheets

(56) References Cited

U.S. PATENT DOCUMENTS

| | | | |
|---|---|---|---|
| 2015/0054809 A1* | 2/2015 | Lim | G09G 3/3696 |
| | | | 345/211 |
| 2015/0205418 A1* | 7/2015 | Nam | G06F 3/0412 |
| | | | 345/174 |
| 2016/0105952 A1* | 4/2016 | Park | G02F 1/1309 |
| | | | 345/174 |
| 2016/0240163 A1* | 8/2016 | Yamamoto | G09G 3/3648 |
| 2018/0277029 A1* | 9/2018 | Lee | G02F 1/1309 |

FOREIGN PATENT DOCUMENTS

| | | | |
|---|---|---|---|
| KR | 10-2015-0055357 A | 5/2015 | |
| KR | 10-2015-0079263 A | 7/2015 | |

* cited by examiner

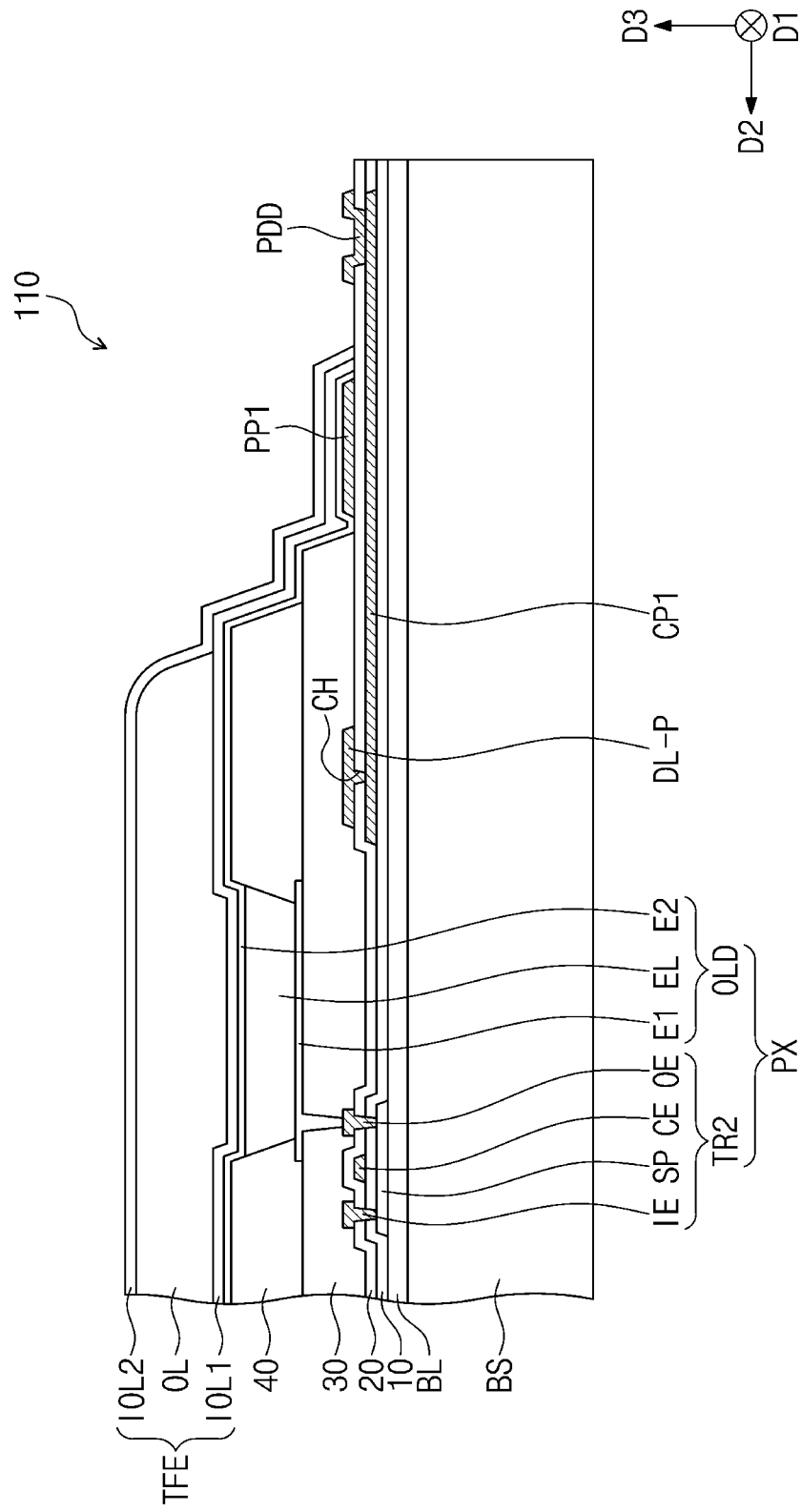

ELECTRONIC PANEL, ELECTRONIC PANEL TEST DEVICE, AND ELECTRONIC PANEL TEST METHOD

CROSS-REFERENCE TO RELATED APPLICATION

This application claims priority to and the benefit Korean Patent Application No. 10-2018-0136736, filed on Nov. 8, 2018 in the Korean Intellectual Property Office, the entire content of which is hereby incorporated by reference in its entirety.

BACKGROUND

1. Field

Aspects of some example embodiments of the present disclosure relate to a device that tests an electronic panel.

2. Description of the Related Art

An organic light emitting display device displays an image using an organic light emitting diode, which is a self-luminous element, and has been highlighted as a next generation display device because organic light emitting display devices have relatively superior brightness and color purity. An organic light emitting display device includes red pixels, green pixels, and blue pixels to form a display panel and displays a variety of color images through the display panel.

An organic light emitting display device includes an electronic panel including a display unit that displays the image and an input sensing unit that senses an external input and outputs information about a position and an intensity of the external input. A process of testing whether the electronic panel of the organic light emitting display device operating normally (or as intended) may be performed when the organic light emitting display device is manufactured.

The above information disclosed in this Background section is only for enhancement of understanding of the background of the invention and therefore it may contain information that does not constitute prior art.

SUMMARY

Aspects of some example embodiments of the present disclosure relate to a device that tests an electronic panel. For example, some example embodiments of the present disclosure relate to a test device that tests an electronic panel including an input sensing unit.

Some example embodiments of the present disclosure include a test device capable of testing an operation state of an input sensing unit according to an operation environment of a display unit.

Some example embodiments of the present disclosure include an electronic panel including panels for testing an operation state of an input sensing unit.

Some example embodiments of the present disclosure include a test method capable of testing an operation state of an input sensing unit according to an operation environment of a display unit.

According to some example embodiments of the inventive concept, a test device includes: signal test pads electrically connected to pads of an input sensing unit, a power test pad electrically connected to a power pattern of a display unit, a test circuit applying a test signal to the signal test pads, a voltage generator generating a sensing power voltage, and a ripple controller changing a voltage level of the sensing power voltage to apply the sensing power voltage to the power test pad.

According to some example embodiments, the ripple controller provides a ripple noise to the sensing power voltage and applies the sensing power voltage including the ripple noise to the power test pad.

According to some example embodiments, the signal test pads include test transmission signal pads and test reception signal pads.

According to some example embodiments, the test circuit outputs a test transmission signal to the test transmission signal pads and receives a test reception signal from the test reception signal pads.

According to some example embodiments, the test circuit further outputs switching signals in synchronization with the test transmission signal to select the voltage level of the sensing power voltage.

According to some example embodiments, the test circuit further outputs switching signals to select the voltage level of the sensing power voltage.

According to some example embodiments, the ripple controller changes the voltage level of the sensing power voltage in response to the switching signals.

According to some example embodiments, the ripple controller includes a plurality of current controllers connected to each other in parallel between a first node and a second node and operated in response to the switching signals, the first node receives the sensing power voltage, and the second node receives a second voltage.

According to some example embodiments, each of the current controllers includes a resistor including one end connected to the first node and the other end and a transistor including a first electrode connected to the other end of the resistor, a second electrode connected to the second node, and a gate electrode receiving a corresponding switching signal among the switching signals.

According to some example embodiments of the inventive concept, an electronic panel includes: a display unit including a display area and a peripheral area adjacent to the display area and an input sensing unit on the display unit to sense an external input applied to a sensing area overlapping with the display area. The display unit includes a power pad in the peripheral area to receive a power voltage and a power pattern in the peripheral area and electrically connected to the power pad. The input sensing unit includes a sensing pad in a non-sensing area around the sensing area and receiving a sensing power voltage and a power line in the non-sensing area and electrically connected to the sensing pad. The power line is electrically connected to the power pattern.

According to some example embodiments, the power line overlaps with the power pattern when viewed in a top view.

According to some example embodiments, the display unit includes a plurality of pixels in the display area. Each of the pixels includes a transistor including a semiconductor pattern, a control electrode spaced apart from the semiconductor pattern, an input electrode connected to the semiconductor pattern, and an output electrode on a same layer as the input electrode and connected to the semiconductor pattern and being covered by an insulating layer, and an organic light emitting device on the insulating layer and including a first electrode, a second electrode on the first electrode, and a light emitting layer between the first electrode and the second electrode, and the power pattern is on a same layer as the output electrode.

According to some example embodiments, the power pattern is electrically connected to the second electrode.

According to some example embodiments, the insulating layer includes a first layer between the first electrode and the output electrode to cover the output electrode, a second layer on the first layer, and a third layer on the second layer, and the first electrode is on the third layer.

According to some example embodiments, the power pattern receives the power voltage via the power pad during a normal mode and receives the sensing power voltage via the sensing pad and the power line during a test mode.

According to some example embodiments, the sensing power voltage includes a ripple noise during the test mode.

According to some example embodiments, the input sensing unit further includes sensing signal pads in the non-sensing area and receiving a test transmission signal and receives the test transmission signal during the test mode.

According to some example embodiments of the inventive concept, in a test method of a test device, which includes signal test pads electrically connected to pads of an input sensing unit and a power test pad electrically connected to a power pattern of a display unit, the method includes outputting a test transmission signal to first pads among the signal test pads, generating a sensing power voltage, changing a voltage level of the sensing power voltage, and receiving a test transmission signal from second pads among the signal test pads.

According to some example embodiments, the changing of the voltage level of the sensing power voltage includes changing the voltage level of the sensing power voltage in synchronization with the test transmission signal.

According to some example embodiments, the changing of the voltage level of the sensing power voltage includes adding a ripple noise to the sensing power voltage.

Thus, according to some example embodiments, a test device may test the operation state of the input sensing unit while providing the power voltage to the display unit. For example, because the characteristic test of the input sensing unit according to the change in the voltage level of the power voltage is possible, defects of the input sensing unit may be relatively easily detected.

BRIEF DESCRIPTION OF THE DRAWINGS

The above and other aspects of some example embodiments of the present disclosure will become more readily apparent by reference to the following detailed description when considered in conjunction with the accompanying drawings wherein:

FIG. 3B is a cross-sectional view showing an area YY shown in FIG. 2;

DETAILED DESCRIPTION

Figure 1:
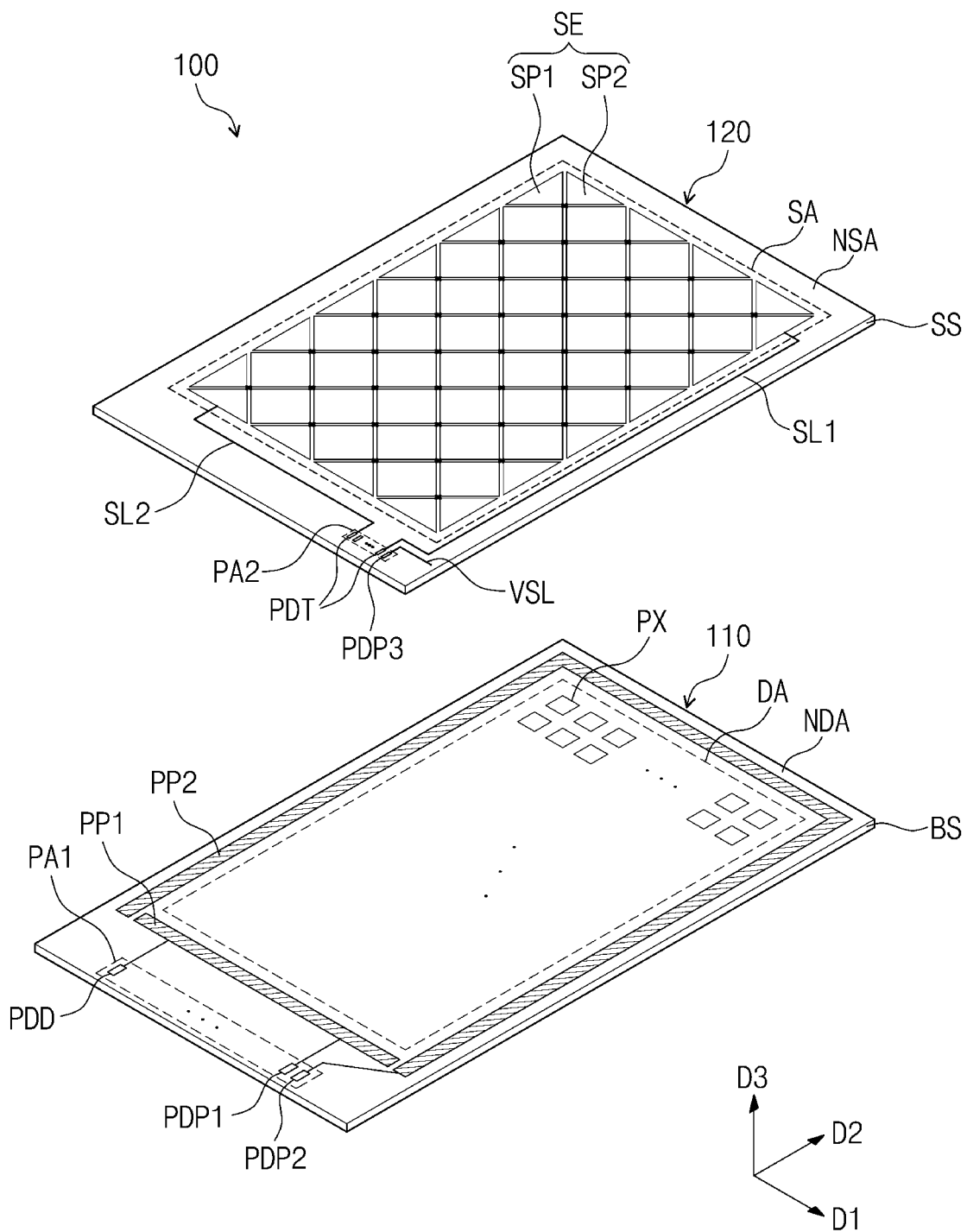
FIG. 1 is an exploded perspective view separately showing some components of an electronic panel according to some example embodiments of the present disclosure.

It will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness of layers, films, and regions are exaggerated for clarity.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

Figure 2:
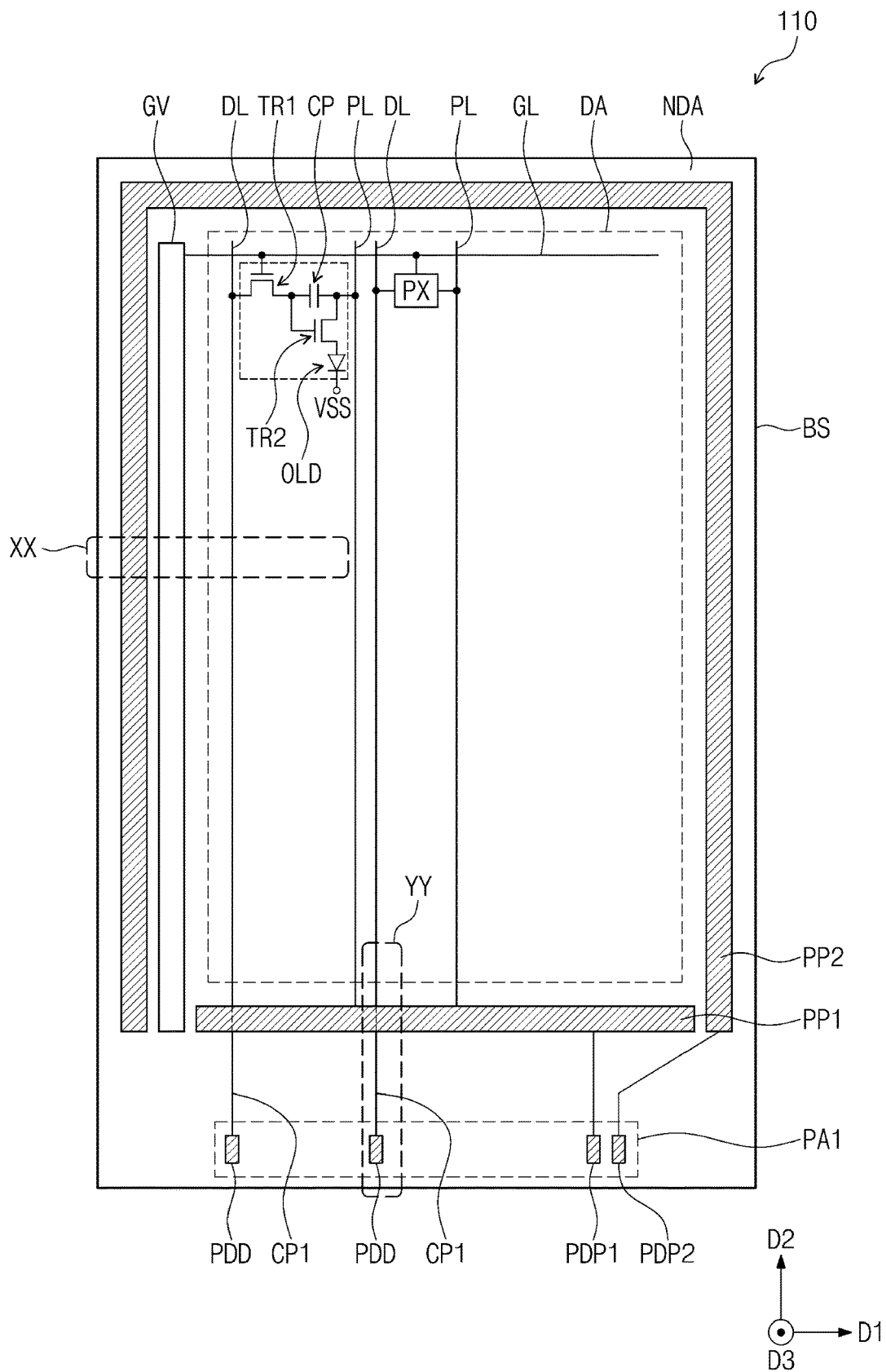
FIG. 2 is a plan view showing a display panel according to some example embodiments of the present disclosure.
Figure 3A:
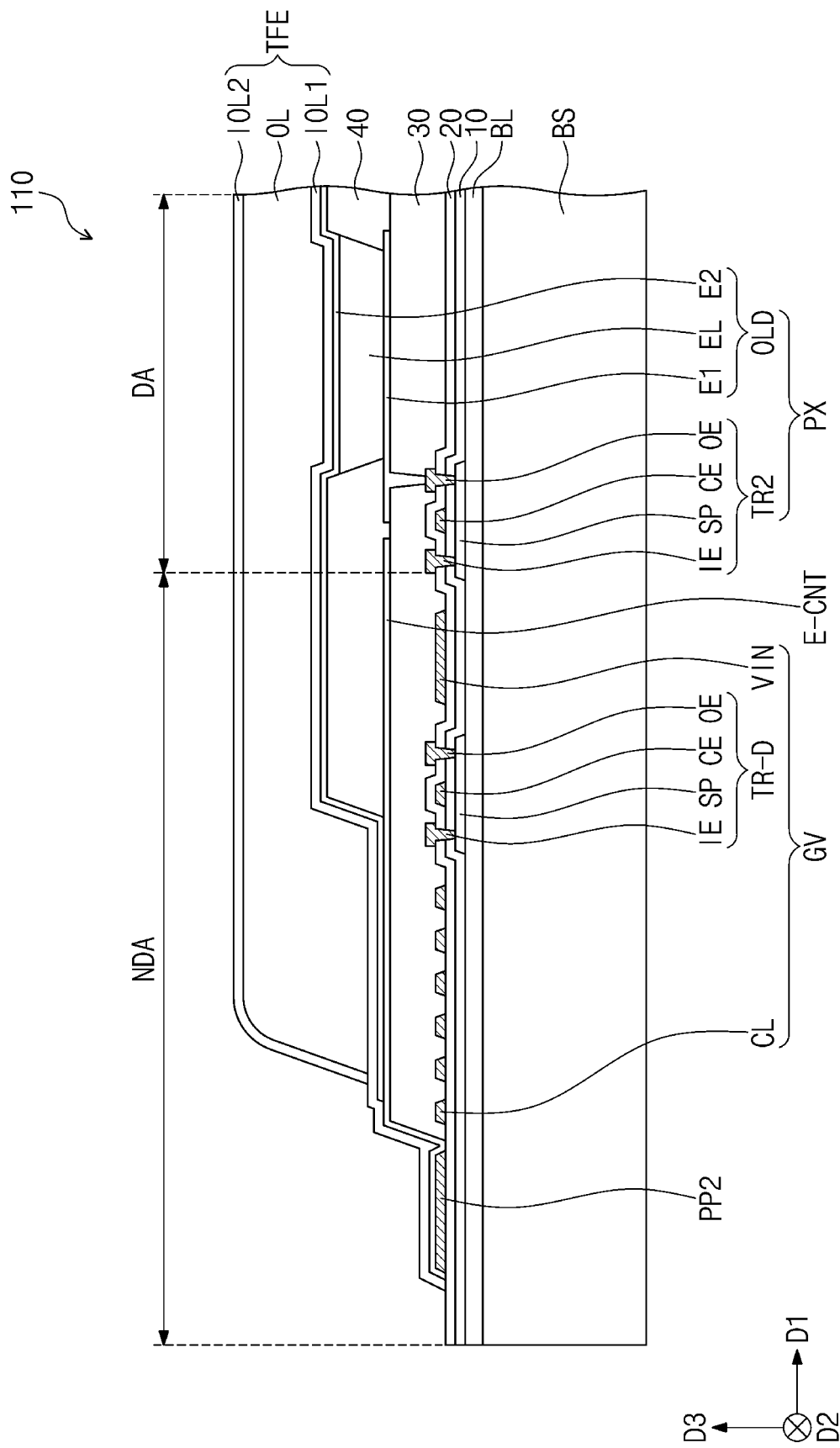
FIG. 3A is a cross-sectional view showing an area XX shown in FIG. 2.

FIG. 1 is an exploded perspective view separately showing some components of an electronic panel according to some example embodiments of the present disclosure. FIG. 2 is a plan view showing a display panel according to some example embodiments of the present disclosure. FIG. 3A is a cross-sectional view showing an area XX shown in FIG. 2. FIG. 3B is a cross-sectional view showing an area YY shown in FIG. 2.

Referring to FIGS. 1 and 2, the electronic panel 100 includes a display unit 110 and an input sensing unit 120. In FIG. 1, for the convenience of explanation, the display unit 110 and the input sensing unit 120 are separated from each other.

The display unit 110 may include a display area DA and a peripheral area NDA. The display area DA may generate and display an image. The peripheral area NDA is arranged adjacent to a display area DA. The peripheral area NDA surrounds an edge of the display area DA, however, this is merely an example. According to some example embodiments, the peripheral area NDA may be arranged adjacent to a portion of the edge of the display area DA or omitted, and embodiments are not limited thereto.

The display unit 110 may generate the image and display the image through the display area DA. The display unit 110 may include a base substrate BS and pixels PX. The display area DA and the peripheral area NDA may be areas provided by the base substrate BS. The base substrate BS may include an insulating substrate. For example, the base substrate BS may include a glass substrate, a plastic substrate, or a combination thereof.

The pixels PX are arranged in the display area DA. The pixels PX are arranged in a first direction D1 and a second direction D2 and spaced apart from each other in a matrix form. Each of the pixels PX receives an electrical signal and emits a light to form the image.

Each of the pixels PX is connected to signal lines. The signal lines include gate lines GL, data lines DL, and power lines PL.

The gate lines GL extend in the first direction D1 and are arranged in the second direction D2 while being spaced apart from each other. The gate lines GL apply gate signals to the pixels PX.

The data lines DL are insulated from the gate lines GL while crossing the gate lines GL. In the present exemplary embodiment, the data lines DL extend in the second direction D2 and are arranged in the first direction D1 while being spaced apart from each other. The data lines DL apply data signals to the pixels PX.

The power lines PL may be insulated from the gate lines GL and the data lines DL. In the present exemplary embodiment, the power lines PL extend in the first direction D1 and are arranged in the second direction D2 while being spaced apart from each other. The power lines PL apply first power signals to the pixels PX.

Each of the pixels PX includes a first transistor TR1, a second transistor TR2, a capacitor CP, and a light emitting device OLD. The first transistor TR1 is turned on in response to the gate signal applied thereto through a corresponding gate line among the gate lines GL to apply the data signal DL, which is applied thereto through a corresponding data line among the data lines, to the capacitor CP.

The capacitor CP is charged with a voltage corresponding to an electric potential difference between a first power voltage ELVDD provided from the power line PL and the data signal. The second transistor TR2 is turned on by the voltage charged in the capacitor CP to provide the first power voltage ELVDD applied thereto through the power line PL to the light emitting device OLD.

The light emitting device OLD may generate the light or may control a light amount of the light in response to the electrical signal. For example, the light emitting device OLD may include an organic light emitting device, a quantum dot light emitting device, an electrophoretic device, or an electrowetting device.

The light emitting device OLD is connected to a power terminal VSS to receive a second power voltage ELVSS different from the first power voltage ELVDD. A driving current corresponding to a difference between the electrical signal provided from the second transistor TR2 and the second power voltage ELVSS flows through the light emitting device OLD, and the light emitting device OLD may generate a light corresponding to the driving current.

Meanwhile, according to some example embodiments of the present disclosure, the pixels PX may include electronic components with various configurations and arrangements, and embodiments are not limited thereto.

The signal lines GL, DL, and PL are located on the base substrate BS. The signal lines GL, DL, and PL include the gate line GL, the data line DL, and the power line PL. The gate line GL, the data line DL, and the power line PL may transmit different electrical signals from each other.

The gate line GL extends in the first direction D1. The gate line GL is provided in plural number, and the gate lines GL are arranged in the second direction D2 and spaced apart from each other. For the convenience of explanation, one gate line GL is shown as an example.

Meanwhile, the display unit 110 includes a gate driving circuit GV mounted on the base substrate BS to apply the electrical signal to the gate line GL.

The gate driving circuit GV may include at least one driving transistor TR-D and a plurality of conductive lines CL and VIN. The driving transistor TR-D has the same structure as the second transistor TR2, however it should not be limited thereto or thereby. That is, the driving transistor TR-D may have different structures from the second transistor TR2. The conductive lines CL and VIN are connected to the driving transistor TR-D to form an electronic circuit. The gate driving circuit GV may be connected to the gate lines GL.

A first power pattern PP1 is located in the peripheral area NDA. The first power pattern PP1 has a quadrangular shape defined by long sides extending in the first direction D1 and short sides extending in the second direction D2. A second power pattern PP2 is located in the peripheral area NDA. The first power pattern PP1 and the second power pattern PP2 are spaced apart from each other when viewed in a plan view. The shape and arrangement of the first power pattern PP1 and the second power pattern PP2 may be changed in various ways without being limited to FIGS. 1 and 2.

A plurality of display pads PDD, PDP1, and PDP2 are located in the peripheral area NDA. Areas of the peripheral area NDA, in which the display pads PDD, PDP1, and PDP2 are located, may be defined as a first pad area PA1. A circuit board may be coupled to the first pad area PA1 to drive the pixels PX. In addition, a test circuit board may be coupled to the first pad area PA1 in a test operation. The circuit board or the test circuit board is electrically connected to the electronic panel 100 via the display pads PDD, PDP1, and PDP2 located in the first pad area PA1.

The display pads PDD, PDP1, and PDP2 may include a data pad PDD and power pads PDP1 and PDP2.

The power pad PDP1 is connected to the first power pattern PP1, and the power pad PDP2 is connected to the second power pattern PP2. The first power pattern PP1 may receive the first power voltage ELVDD provided from an outside via the power pad PDP1. The second power pattern PP2 may receive the second power voltage ELVSS provided from the outside via the power pad PDP2.

The input sensing unit (or input sensor) 120 is located on the display unit (or display or display panel) 110. The input sensing unit 120 senses an external input to acquire information about a position and an intensity of the external input. The input sensing unit 120 may include a sensing insulating layer SS, a sensing electrode SE, a plurality of sensing lines SL1 and SL2, and a plurality of sensing pads PDT and PDP3.

The input sensing unit 120 may include a sensing area SA and a non-sensing area NSA. The sensing area SA is an area that is able to sense the external input. The sensing area SA may overlap with the display area DA.

The non-sensing area NSA is located adjacent to the sensing area SA. The non-sensing area NSA surrounds an edge of the sensing area SA, however, this is merely exemplary. According to some example embodiments, the non-sensing area NSA may be located adjacent to a portion of the edge of the sensing area SA or may be omitted, however embodiments are not limited thereto.

The sensing electrode SE is located in the sensing area SA. The sensing electrode SE includes a first sensing electrode SP1 and a second sensing electrode SP2, which receive different electrical signals from each other. The sensing electrode SE may acquire information about the external input based on a variation in capacitance between the first sensing electrode SP1 and the second sensing electrode SP2.

The first sensing electrode SP1 extends in the first direction D1. The first sensing electrode SP1 is provided in plural number, and the first sensing electrodes SP1 are arranged in the second direction D2 and spaced apart from each other. The second sensing electrode SP2 extends in the second direction D2. The second sensing electrode SP2 is provided in plural number, and the second sensing electrodes SP2 are arranged in the first direction D1 and spaced apart from each other.

First and second sensing lines SL1 and SL2 and the sensing pads PDT and PDP3 are located in the non-sensing area NSA. The sensing pads PDT are connected to the first sensing line SL1 and the second sensing line SL2. The first sensing line SL1 connects the first sensing electrode SP1 and the sensing pad PDT to transmit the electrical signal, which is provided from the outside, to the first sensing electrode SP1 via the sensing pad PDT. The second sensing line SL2 connects the second sensing electrode SP2 and the sensing pad PDT to transmit the electrical signal, which is provided from the second sensing electrode SP2, to the outside via the sensing pad PDT.

An area, in which the sensing pads PDT and PDP3 are located, among the non-sensing area NSA may be defined as a second pad area PA2. A circuit board used to drive the first sensing electrode SP1 and the second sensing electrode SP2 may be coupled to the second pad area PA2. In addition, a test circuit board may be coupled to the second pad area PA2 in a test operation. The circuit board or the test circuit board is electrically connected to the electronic panel 100 via the sensing pads PDT and PDP3 located in the second pad area PA2.

Meanwhile, in the present exemplary embodiment, the sensing pad PDP3 may be electrically connected to the second power pattern PP2 of the display unit 110. That is, the sensing pad PDP3 and the display unit 110 are located on different layers from each other, but may be electrically connected to each other.

Referring to FIGS. 2 to 3B, the base substrate BS may be the insulating substrate. For example, the base substrate BS may include the plastic substrate or the glass substrate. An auxiliary layer BL is located on the base substrate BS to cover an entire surface of the base substrate BS. The auxiliary layer BL includes an inorganic material. The auxiliary layer BL includes a barrier layer and/or a buffer layer. Accordingly, the auxiliary layer BL prevents or reduces instances of oxygen or moisture entering through the base substrate BS from infiltrating into the pixels PX and reduces a surface energy of the base substrate BS such that the pixels PX are relatively stably formed on the base substrate BS.

The pixels PX may be arranged in the display area DA. In some example embodiments, the second transistor TR2 and the light emitting device OLD among components of an equivalent circuit of the pixels PX shown in FIG. 2 are shown as an example. Each of first, second, third, and fourth insulating layers 10, 20, 30, and 40 may include an organic material and/or an inorganic material and may have a single- or multi-layer structure.

The second transistor TR2 is located on the base substrate BS and includes a control electrode CE, an input electrode IE, an output electrode OE, and a semiconductor pattern SP. The control electrode CE is located spaced apart from the semiconductor pattern SP with the first insulating layer 10 interposed therebetween and is connected to one electrode of the capacitor CP. Each of the input electrode IE and the output electrode OE is located on the second insulating layer 20 and connected to the semiconductor pattern SP after penetrating through the first insulating layer 10 and the second insulating layer 20. The input electrode IE is connected to the other electrode of the capacitor CP, and the output electrode OE is connected to the light emitting device OLD.

The light emitting device OLD is connected to the second transistor TR2 and the power terminal VSS. The light emitting device OLD includes a first electrode E1, a light emitting layer EL, and a second electrode E2. The first electrode E1 is located on the third insulating layer 30 and connected to the second transistor TR2 after penetrating through the third insulating layer 30. The light emitting layer EL covers the first electrode E1 exposed through the fourth insulating layer 40. The light emitting layer EL may include a light emitting material that generates the light in response to the electric potential difference. For example, the light emitting layer EL may include an organic light emitting material or a quantum dot.

The second electrode E2 is located on the light emitting layer EL. The second electrode E2 is formed on an entire surface of the display area DA. The second electrode E2 extends from the display area DA to the peripheral area NDA and is connected to a connection pattern E-CNT. The connection pattern E-CNT may correspond to the power terminal VSS.

The power terminal VSS applies the second power voltage ELVSS to the light emitting device OLD. The second power voltage ELVSS may have an electric potential different from that of the first power voltage ELVDD. The light emitting device OLD generates a light corresponding to an electric potential difference between the data signal provided from the second transistor TR2 and the second power voltage ELVSS provided from the power terminal VSS and emits the light.

The gate driving circuit GV may include at least one driving transistor TR-D and a plurality of conductive lines CL and VIN. The driving transistor TR-D has the same structure as the second transistor TR2, however, it should not be limited thereto or thereby. That is, the driving transistor TR-D may have a structure different from the second transistor TR2. The conductive lines CL and VIN are connected to the driving transistor TR-D to form the electronic circuit. The gate driving circuit GV may be connected to the gate lines GL.

The gate lines GL extend from the display area DA and are connected to the gate driving circuit GV located in the peripheral area NDA. The gate driving circuit GV applies electrical signals, for example, the gate signals to the pixels PX, respectively, via the gate lines GL.

According to some example embodiments, one gate driving circuit GV is shown, however, the gate driving circuit GV may be provided in plural number. In embodiments having a plurality of gate driving circuits GV, the gate driving circuits GV may be located or arranged such that they are spaced apart from each other with the display area DA interposed therebetween in the first direction D1. In addition, according to some example embodiments, the gate driving circuit GV is directly positioned on the base substrate BS, however, embodiments are not limited thereto or thereby. That is, the gate driving circuit GV may be provided after being mounted on a separate circuit board. In this case, the gate driving circuit GV may be connected to the display unit 110 via a conductive adhesive member. The gate driving circuit GV according to some example embodiments of the present disclosure may be provided in various ways, however embodiments are not limited thereto.

A first conductive pattern CP1 connects the data lines DL and the data pads PDD. The first conductive pattern CP1 includes a plurality of line patterns that extends in the second direction D2 and is arranged in the first direction D1 while being spaced apart from each other.

According to some example embodiments, the first conductive pattern CP1 may be located on a different layer from the data lines DL. For example, the first conductive pattern CP1 may be located on the same layer as the control electrode CE (e.g., the gate lines GL). In this case, a data line connection terminal DL-P extending from the data lines DL may be connected to the first conductive pattern CP1 located between the first insulating layer 10 and the second insulating layer 20 via a contact hole CH defined through the second insulating layer 20.

However, this is merely an example, and the first conductive pattern CP1 may be located on the same layer as the data lines DL. For example, the first conductive pattern CP1 may be integrally formed with the data lines DL and provided as portions of the data lines DL or may be respectively connected to each of the data lines DL via a separate bridge pattern. The first conductive pattern CP1 according to some example embodiments of the present disclosure may have various shapes as long as the first conductive pattern CP1 is connected to the data lines DL, and embodiments are not limited thereto.

The first power pattern PP1 is located in the peripheral area NDA and connected to the power lines PL extending from the display area DA. The power lines PL are connected to the first power pattern PP1 to apply the first power voltage ELVDD of the same electric potential to each of the pixels PX.

The second power pattern PP2 is connected to the light emitting device OLD to provide a second power signal. The connection pattern E-CNT extends to the second power pattern PP2 to electrically connect the second electrode E2 and the second power pattern PP2. The power terminal VSS of each of the pixels PX may be a terminal substantially connected to a second pattern CP22. The second pattern CP22 may apply the second power voltage ELVSS of substantially the same electric potential to each of the pixels PX.

According to some example embodiments, a second conductive pattern CP2 is arranged on a layer different from the first conductive pattern CP1. According to some example embodiments, the second conductive pattern CP2 may be located above the first conductive pattern CP1. The second conductive pattern CP2 may be arranged to overlap with the first conductive pattern CP1 in a fan-out area FOA when viewed in a plan view.

The second conductive pattern CP2 and the first conductive pattern CP1 are insulated from each other while crossing each other in the fan-out area FOA. The first conductive pattern CP1 may be insulated from each of a first pattern CP21 and the second pattern CP22 of the second conductive pattern CP2 while crossing the first and second patterns CP21 and CP22. This will be described in more detail later.

An encapsulation layer TFE is located on the fourth insulating layer 40 to encapsulate the light emitting device OLD. The encapsulation layer TFE may include a first inorganic layer IOL1, an organic layer OL, and a second inorganic layer IOL2, which are sequentially stacked in a third direction D3, however this is merely an example. That is, the encapsulation layer TFE may further include an inorganic layer and an organic layer, and at least one of the first inorganic layer IOL1, the organic layer OL, and the second inorganic layer IOL2 may be omitted.

According to some example embodiments, the organic layer OL extends to an area in which the gate driving circuit GV is located and is not overlapped with the first pattern CP21 and the second pattern CP22. However, according to some example embodiments, the organic layer OL may extend to the area in which the organic layer OL overlaps with the second conductive pattern CP2 when viewed in a plan view, but embodiments are not limited thereto.

The pads PDD, PDP1, and PDP2 may be located in the first pad area PA1. The pads PDD, PDP1, and PDP2 are arranged in the first direction D1 and spaced apart from each other. The first pad area PA1 may be the area to which the circuit board is connected. The pads PDD, PDP1, and PDP2 may receive signals provided from the circuit board, respectively.

Each of the data pads PDD is connected to the first conductive pattern CP1. The data pads PDD may be data pads that respectively apply the data signal provided from the circuit board to the data lines DL.

According to some example embodiments, the data pads PDD may be arranged on a layer different from the first conductive pattern CP1. For example, the data pads PDD may be arranged on the second insulating layer 20 and may be connected to the first conductive pattern CP1 after penetrating through the second insulating layer 20, however this is merely an example. The data pads PDD may be arranged on the same layer as the first conductive pattern CP1 and may be integrally formed with the first conductive pattern CP1.

Meanwhile, the first power pattern PP1 and the second power pattern PP2 may respectively receive the first power voltage ELVDD and the second power voltage ELVSS through the first power pad PDP1 and the second power pad PDP2, which are arranged in the first pad area PA1.

Figure 4:
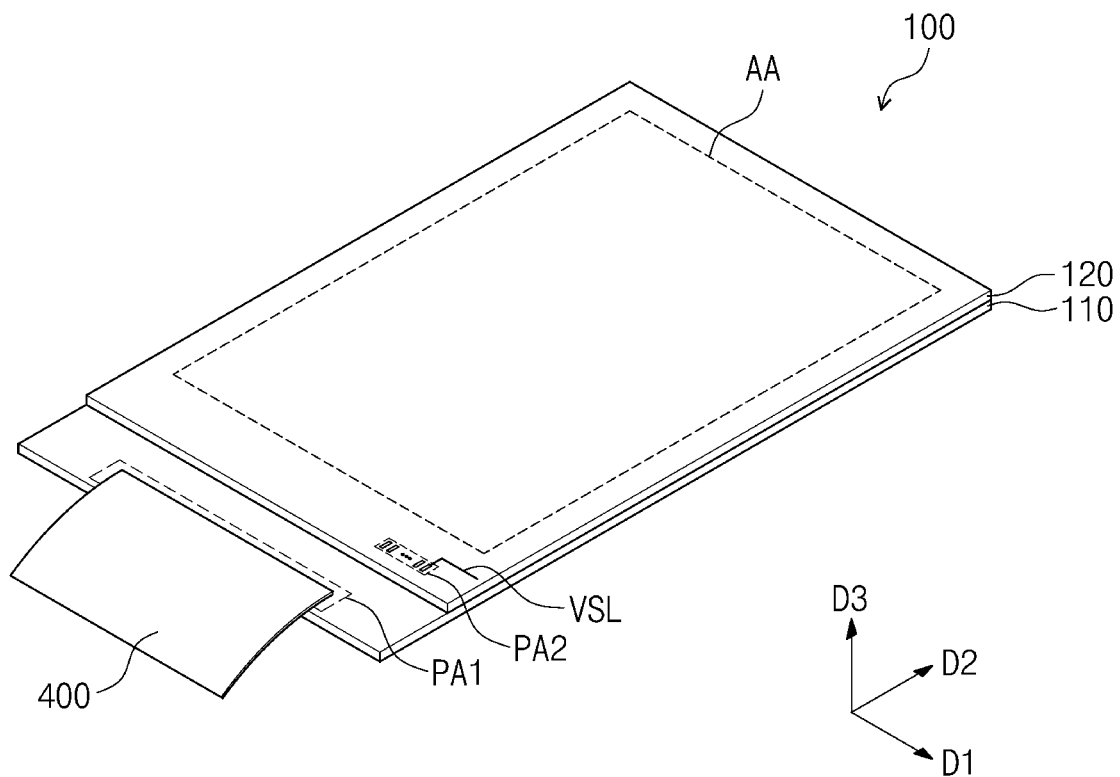
FIG. 4 is a perspective view showing a test circuit board connected to a display unit of an electronic panel in a test operation.

FIG. 4 is a perspective view showing the test circuit board connected to the display unit of the electronic panel in the test operation.

Referring to FIG. 4, an active area AA may include the display area DA of the display unit 110 and the sensing area SA of the input sensing unit 120 shown in FIG. 1. The sensing area SA may overlap with the display area DA.

A first test circuit board 400 may be implemented by a flexible printed circuit board (FPCB) and may include a pad part arranged on a lower surface of one end thereof. The pad part of the first test circuit board 400 may be connected to the first pad area PA1 of the display unit 110.

According to some example embodiments, the first test circuit board 400 may include a test circuit to test the display unit 110. The test circuit of the first test circuit board 400 may provide driving signals to drive the light emitting devices OLD arranged on the display unit 110. In addition, according to some example embodiments, color characteristics of the light emitting device OLD, such as color coordinates, efficiency, and current consumption, may be measured using a color difference meter or a spectrometer, and an image quality test, such as a flicker test, may be performed by the test circuit of the first test circuit board 400 while the driving signals are provided to the display unit 110.

When the test operation on the display unit 110 is completed, the test operation may be performed on the input sensing unit 120.

Figure 5:
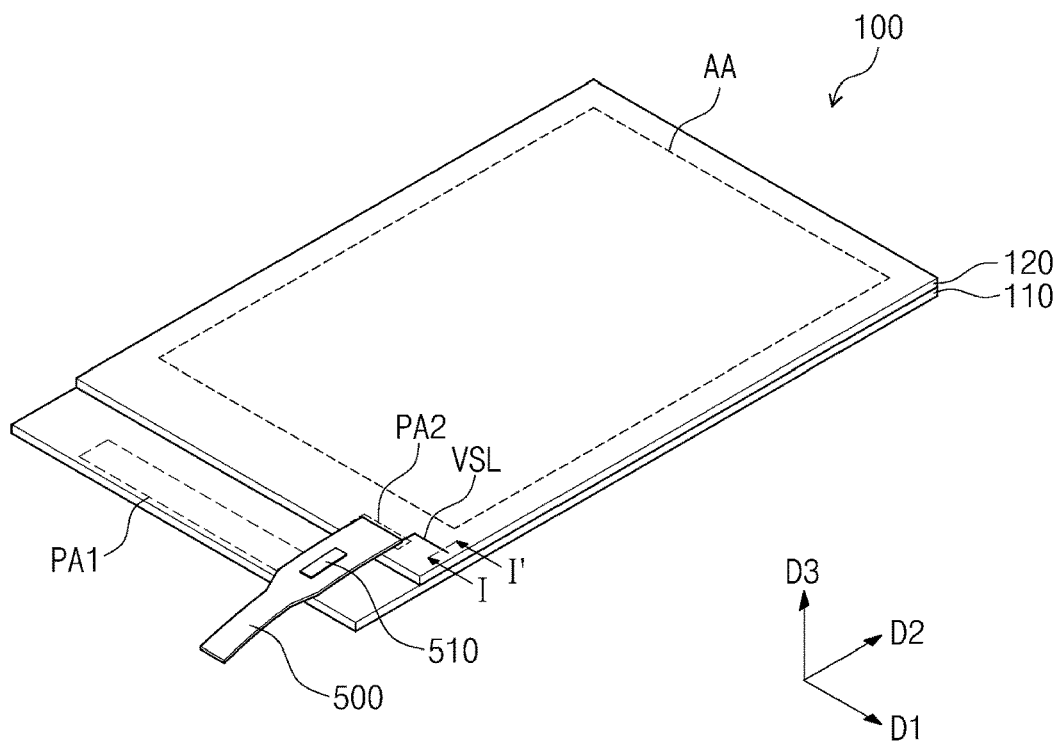
FIG. 5 is a perspective view showing a test circuit board connected to an input sensing unit of an electronic panel in a test operation.

FIG. 5 is a perspective view showing the test circuit board connected to the input sensing unit of the electronic panel in the test operation.

Referring to FIG. 5, a second test circuit board 500 (or a test device) may be implemented by a flexible printed circuit board (FPCB) and may include a pad part located on a lower surface of one end thereof. The pad part of the second test circuit board 500 may be connected to the second pad area PA2 of the input sensing unit 120.

The second test circuit board 500 may include a sensing test circuit 510 used to test the input sensing unit 120. The sensing test circuit 510 may perform a test operation of characteristics and defects on the sensing electrode SE and the sensing lines SL1 and SL2 (refer to FIG. 1), which are arranged in the input sensing unit 120. The sensing test circuit 510 may be implemented by an integrated circuit (IC).

As shown in FIG. 3A, the second electrode E2 electrically connected to the second power pattern PP2 is arranged above the display unit 110 and located adjacent to the input sensing unit 120. When a voltage level of the second power voltage ELVSS provided to the second power pattern PP2 is changed, the sensing characteristics of the input sensing unit 120 may be changed. For example, when the image displayed through the display unit 110 is changed to a black image from a white image or vice versa, an amount of change in the consumption current of the display unit 110 may increase. The change in the consumption current causes a change in the voltage level of the second power voltage ELVSS, resulting in a ripple on the second power voltage ELVSS.

When a capacitance between the sensing electrode SE and the second electrode E2 varies due to the change in the voltage level of the second power voltage ELVSS, the capacitance between the first sensing electrode SP1 and the second sensing electrode SP2 is changed, and thus information about the external input may be distorted.

Accordingly, in the test operation with respect to the input sensing unit 120, the test operation may be performed on the input sensing unit 120 after the first test circuit board 400 is connected to the display unit 110 and substantially simultaneously the second test circuit board 500 may be connected to the input sensing unit 120.

However, it may be physically difficult to simultaneously connect the first test circuit board 400 and the second test circuit board 500 to the electronic panel 100, and there may be a difficulty in that related-art test operations may be required to be changed.

The second test circuit board 500 according to some example embodiments outputs the second power voltage ELVSS to apply the second power voltage ELVSS to the second power pattern PP2 of the display unit 110. For example, the second power voltage ELVSS may include ripple noise caused by operation characteristics of the display unit 110. Accordingly, the test operation for the characteristics and defects of the input sensing unit 120 may be performed in the state in which the ripple noise is included in the second power voltage ELVSS.

As shown in FIGS. 1 and 5, a second power line VSL electrically connected to the sensing pad PDP3 is located in the non-sensing area NSA of the input sensing unit 120.

Figure 6:
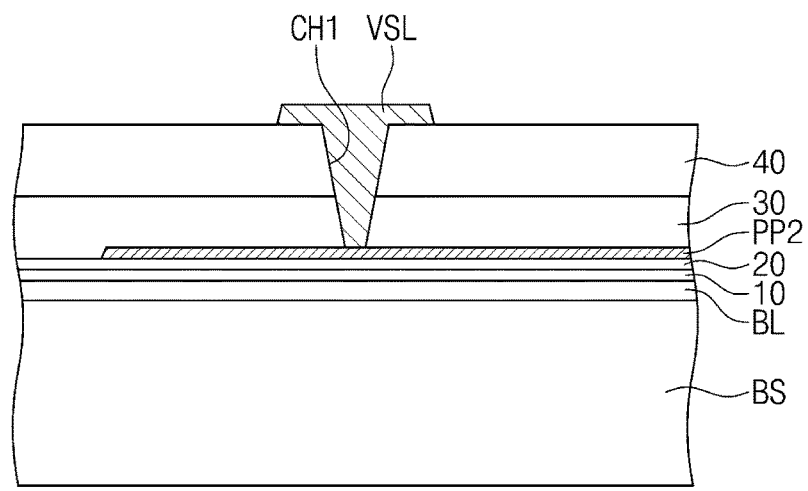
FIG. 6 is a cross-sectional view taken along a line I-I' of FIG. 5 to show the electronic panel.

FIG. 6 is a cross-sectional view taken along a line I-I' of FIG. 5 to show the electronic panel.

Referring to FIG. 6, the second power line VSL may be connected to the second power pattern PP2 through a contact hole CH1 formed through the third insulating layer 30 and the fourth insulating layer 40 of the display unit 110. When viewed in a top view, the second power line VSL may overlap with the second power pattern PP2.

Referring to FIGS. 5 and 6, the second power voltage ELVSS provided from the sensing test circuit 510 of the second test circuit board 500 may be applied to the second power pattern PP2 via the second power line VSL.

Accordingly, the sensing test circuit 510 may test the operation state of the input sensing unit 120 while providing the second power voltage ELVSS to the display unit 110. For example, because the characteristic test of the input sensing unit 120 according to the change in voltage level of the second power voltage ELVSS may be possible, the defect in the input sensing unit 120 may be relatively easily detected.

Figure 7:
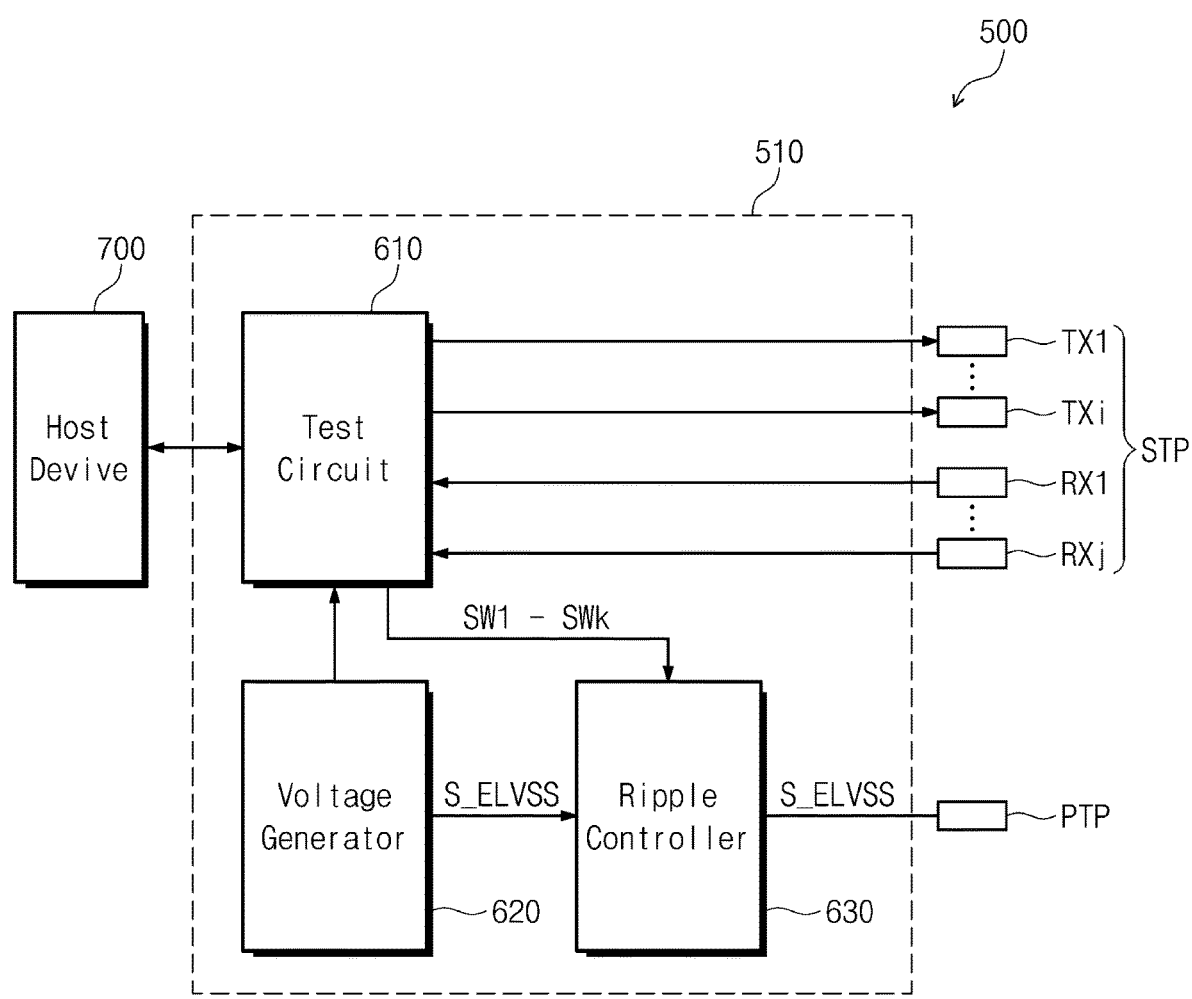
FIG. 7 is a block diagram showing a configuration of a second test circuit board according to some example embodiments of the present disclosure.

FIG. 7 is a block diagram showing a configuration of a second test circuit board according to some example embodiments of the present disclosure. In FIG. 7, only the circuit components associated with some example embodiments of the present disclosure are shown and described, however, the embodiments of the present disclosure are not limited thereto or thereby.

Referring to FIG. 7, the second test circuit board 500 includes the sensing test circuit 510, signal test pads STP, and a power test pad PTP. The signal test pads STP include test transmission signal pads TX1 to TXi and test reception signal pads RX1 to RXj.

The sensing test circuit 510 includes a test circuit 610, a voltage generator 620, and a ripple controller 630.

The test circuit 610 outputs a test transmission signal to the test transmission signal pads TX1 to TXi and receives a test reception signal from the test reception signal pads RX1 to RXj.

The voltage generator 620 generates a sensing power voltage S_ELVSS. The voltage generator 620 may further generate voltages required for an operation of the test circuit 610. The voltage generator 620 may be implemented by a DC-DC converter.

The ripple controller 630 changes a voltage level of the sensing power voltage S_ELVSS and outputs the sensing power voltage S_ELVSS to the power test pad PTP. According to some example embodiments, the ripple controller 630 may output the sensing power voltage S_ELVSS in which the ripple noise is included to the power test pad PTP. In addition, the ripple controller 630 may change the voltage level of the sensing power voltage S_ELVSS in synchronization with one of the test transmission signals provided to the test transmission signal pads TX1 to TXi.

According to some example embodiments, the ripple controller 630 may change the voltage level of the sensing power voltage S_ELVSS in response to switching signals SW1 to SWk from the test circuit 610. The test circuit 610 may output the switching signals SW1 to SWk in synchronization with one of the test transmission signals provided to the test transmission signal pads TX1 to TXi.

Figure 8:
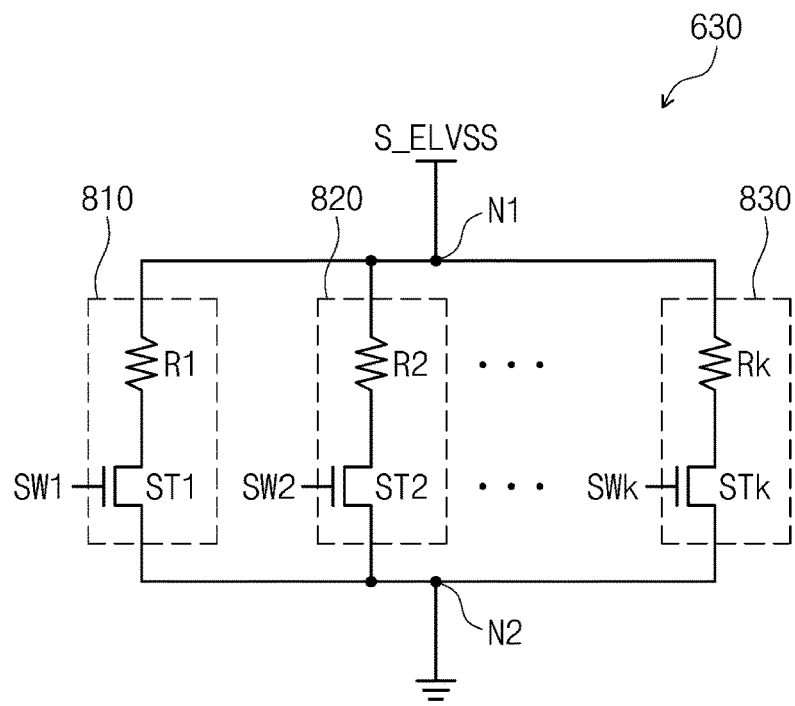
FIG. 8 is a circuit diagram showing a circuit configuration of a ripple controller shown in FIG. 7.

FIG. 8 is a circuit diagram showing a circuit configuration of the ripple controller shown in FIG. 7.

Referring to FIG. 8, the ripple controller 630 includes a plurality of current controllers 810 to 830. The current controllers 810 to 830 are connected to each other in parallel between a first node N1 and a second node N2 and are operated in response to the switching signals SW1 to SWk.

The first node N1 may receive the sensing power voltage S_ELVSS, and the second node N2 may receive a ground voltage (or a second voltage).

Each of the current controllers 810 to 830 includes a resistor and a switching transistor. One end of a resistor R1 of the current controller 810 is connected to the first node N1. A switching transistor ST1 of the current controller 810 includes a first electrode connected to the other end of the resistor R1, a second electrode connected to the second node N2, and a gate electrode receiving the switching signal SW1. One end of a resistor R2 of the current controller 820 is connected to the first node N1. A switching transistor ST2 of the current controller 820 includes a first electrode connected to the other end of the resistor R2, a second electrode connected to the second node N2, and a gate electrode receiving the switching signal SW2. One end of a resistor Rk of the current controller 830 is connected to the first node N1. A switching transistor STk of the current controller 830 includes a first electrode connected to the other end of the resistor Rk, a second electrode connected to the second node N2, and a gate electrode receiving the switching signal SWk.

When the switching transistors ST1 to STk in the current controllers 810 to 830 are turned on/off in response to the switching signals SW1 to SWk, a resistance between the first node N1 and the second node N2 is changed, and as a result, an amount of current between the first node N1 and the second node N2 is changed. As described above, the voltage level of the sensing power voltage S_ELVSS may be changed by controlling the ON/OFF of the switching transistors ST1 to STk.

Figure 9:
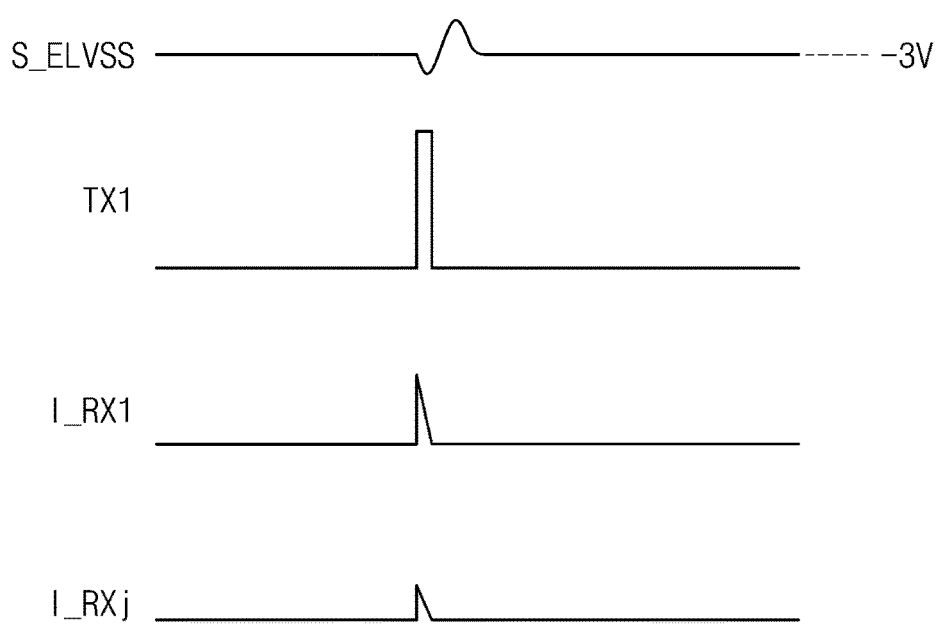
FIG. 9 is a timing diagram showing an operation of the second test circuit board shown in FIG. 7.

FIG. 9 is a timing diagram showing an operation of the second test circuit board shown in FIG. 7.

Referring to FIGS. 7 to 9, the test circuit 610 outputs the test transmission signal to the test transmission signal pads TX1 to TXi. FIG. 9 shows only the test transmission signal provided to the test transmission signal pad TX1, however, the test circuit 610 may sequentially or substantially simultaneously transmit the test transmission signals to the test transmission signal pads TX1 to TXi.

The test circuit 610 outputs the switching signals SW1 to SWk at a transition point of the test transmission signal output to the test transmission signal pad TX1. The test circuit 610 may control an output order and a pulse width of the switching signals SW1 to SWk, and thus may change the voltage level of the sensing power voltage S_ELVSS in various ways.

For example, when the image displayed through the display unit 110 is changed to the black image from the white image or vice versa, the amount of change in the consumption current of the display unit 110 may increase. When assuming that the image displayed through the display unit 110 is changed to the black image from the white image, the voltage level of the second power pattern PP2 of the display unit 110 may become lower than a normal level (e.g., about −3 volts). When assuming that the image displayed through the display unit 110 is changed to the white image from the black image, the voltage level of the second power pattern PP2 of the display unit 110 may become higher than the normal level (e.g., about −3 volts).

The test circuit 610 may output the switching signals SW1 to SWk by taking into account the change of the voltage level such that the voltage level of the sensing power voltage S-ELVSS of the display unit 110 is changed to a lower or higher level than the normal level (e.g., about −3 volts).

In addition, the test circuit 610 may output the switching signals SW1 to SWk such that the voltage level of the sensing power voltage S_ELVSS is changed in an active period of the test transmission signal output to the test transmission signal pad TX1, thereby more precisely testing the characteristics of the input sensing unit 120.

Figure 10:
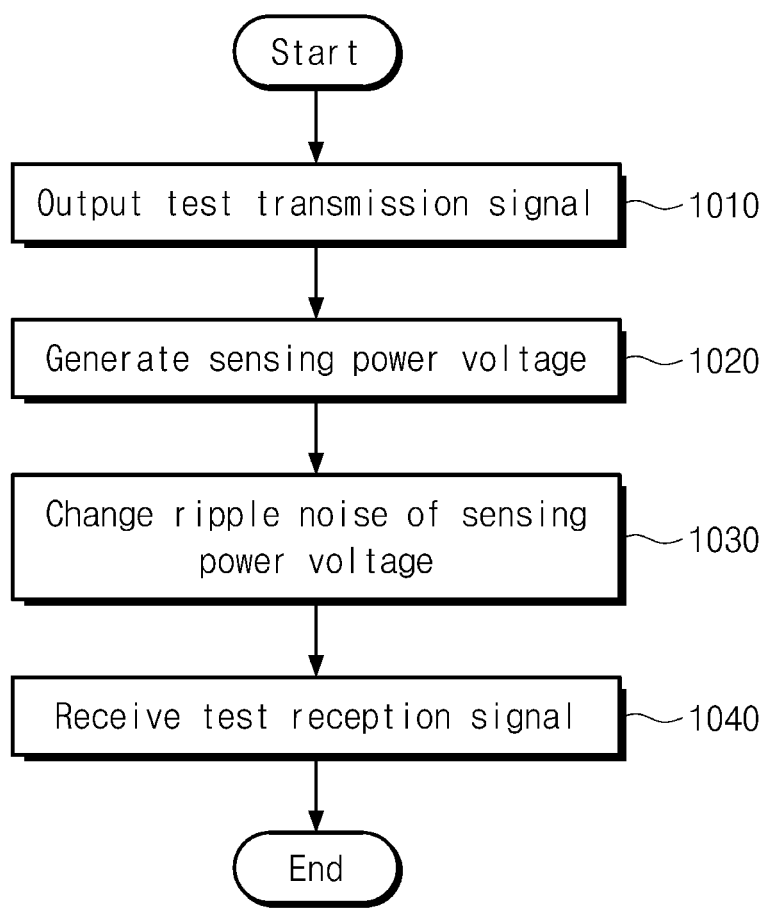
FIG. 10 is a flowchart showing a test method of a test device according to some example embodiments of the present disclosure.

FIG. 10 is a flowchart showing a test method of a test device according to some example embodiments of the present disclosure. For the convenience of explanation, the test method will be described with reference to the electronic panel 100 and the second test circuit board 500 shown in FIGS. 1 to 7, however, the test method according to the present disclosure is not limited thereto or thereby.

Referring to FIG. 10, the test circuit 610 (refer to FIG. 7) outputs the test transmission signal to the test transmission signal pads TX1 to TXi (1010).

The voltage generator 620 (refer to FIG. 7) generates the sensing power voltage S_ELVSS (1020).

The ripple controller 630 (refer to FIG. 7) changes the ripple noise of the sensing power voltage S_ELVSS (1030). The sensing power voltage S_ELVSS is provided to the input sensing unit 120 via the power test pad PTP. The sensing power voltage S_ELVSS provided via the sensing pad PDP3 of the input sensing unit 120 is provided to the second power pattern PP2 of the display unit 110 via the second power line VSL.

The test circuit 610 receives the test reception signal from the test reception signal pads RX1 to RXj (1040).

According to the above-described test method, the test operation for the characteristics and defects of the input sensing unit 120 may be performed while the sensing power voltage S_ELVSS is provided to the second power pattern PP2 of the display unit 110. For example, because the ripple noise is included in the sensing power voltage S_ELVSS, the accuracy of the test of the input sensing unit 120 may be improved.

Although aspects of some example embodiments of the present disclosure have been described, it is understood that the present disclosure should not be limited to these example embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the following claims and their equivalents.

What is claimed is:

1. A test device comprising:
 a plurality of signal test pads electrically connected to pads of an input sensing unit;
 a power test pad electrically connected to a power pattern of a display unit;
 a test circuit configured to apply a test signal to the signal test pads;

a voltage generator configured to generate a sensing power voltage having a normal level; and a ripple controller configured to change a voltage level of the sensing power voltage to apply the sensing power voltage to the power test pad, wherein the ripple controller is configured to introduce a ripple noise to the sensing power voltage such that the voltage level of the sensing power voltage is changed to a lower or higher level than the normal level to be applied to the power test pad.

2. The test device of claim 1, wherein the ripple controller is configured to provide the ripple noise to the sensing power voltage and to apply the sensing power voltage comprising the ripple noise to the power test pad.

3. The test device of claim 1, wherein the signal test pads comprise test transmission signal pads and test reception signal pads.

4. The test device of claim 3, wherein the test circuit is configured to output a test transmission signal to the test transmission signal pads and to receive a test reception signal from the test reception signal pads.

5. The test device of claim 4, wherein the test circuit is further configured to output switching signals in synchronization with the test transmission signal to select the voltage level of the sensing power voltage.

6. The test device of claim 1, wherein the test circuit is further configured to output switching signals to select the voltage level of the sensing power voltage.

7. The test device of claim 6, wherein the ripple controller is configured to change the voltage level of the sensing power voltage in response to the switching signals.

8. The test device of claim 6, wherein the ripple controller comprises a plurality of current controllers connected to each other in parallel between a first node and a second node and operated in response to the switching signals, the first node is configured to receive the sensing power voltage, and the second node is configured to receive a second voltage.

9. The test device of claim 8, wherein each of the current controllers comprises:

a resistor comprising one end connected to the first node and the other end; and a transistor comprising a first electrode connected to the other end of the resistor, a second electrode connected to the second node, and a gate electrode receiving a corresponding switching signal among the switching signals.

10. An electronic panel comprising:

a display unit comprising a display area and a peripheral area adjacent to the display area; and an input sensing unit on the display unit configured to sense an external input applied to a sensing area overlapping with the display area, the display unit comprising:

a power pad in the peripheral area configured to receive a power voltage; and a power pattern in the peripheral area and electrically connected to the power pad, the input sensing unit comprising:

a sensing pad in a non-sensing area around the sensing area and configured to receive a sensing power voltage; and a power line in the non-sensing area and electrically connected to the sensing pad, wherein the power line is electrically connected to the power pattern, wherein a voltage level of the sensing power voltage is changed to a lower or higher level than a normal level during a test mode such that a ripple noise is introduced to the sensing power voltage applied to the sensing pad during the test mode.

11. The electronic panel of claim 10, wherein the power line overlaps with the power pattern when viewed in a top view.

12. The electronic panel of claim 10, wherein the display unit comprises a plurality of pixels in the display area, each of the pixels comprises:

a transistor comprising a semiconductor pattern, a control electrode spaced apart from the semiconductor pattern, an input electrode connected to the semiconductor pattern, and an output electrode on a same layer as the input electrode and connected to the semiconductor pattern, the transistor being covered by an insulating layer; and an organic light emitting device on the insulating layer and comprising a first electrode, a second electrode on the first electrode, and a light emitting layer between the first electrode and the second electrode, and the power pattern is on a same layer as the output electrode.

13. The electronic panel of claim 12, wherein the power pattern is electrically connected to the second electrode.

14. The electronic panel of claim 12, wherein the insulating layer comprises:

a first layer between the first electrode and the output electrode to cover the output electrode;

a second layer on the first layer; and a third layer on the second layer, and the first electrode is on the third layer.

15. The electronic panel of claim 12, wherein the power pattern is configured to receive the power voltage via the power pad during a normal mode and to receive the sensing power voltage via the sensing pad and the power line during the test mode.

16. The electronic panel of claim 10, wherein the sensing power voltage comprises the ripple noise during the test mode.

17. The electronic panel of claim 15, wherein the input sensing unit further comprises sensing signal pads in the non-sensing area and is configured to receive a test transmission signal during the test mode.

18. A test method of a test device that comprises signal test pads electrically connected to pads of an input sensing unit and a power test pad electrically connected to a power pattern of a display unit, the test method comprising:

outputting a test transmission signal to first pads among the signal test pads;

generating a sensing power voltage;

changing a voltage level of the sensing power voltage; and receiving a test transmission signal from second pads among the signal test pads, wherein the changing of the voltage level of the sensing power voltage comprises adding a ripple noise to the sensing power voltage to change the sensing power voltage to a higher level or a lower level than a normal level such that the ripple noise is introduced to the sensing power voltage and applied to the power test pad with the ripple noise.

19. The test method of claim 18, wherein the changing of the voltage level of the sensing power voltage comprises changing the voltage level of the sensing power voltage in synchronization with the test transmission signal.

* * * * *